United States Patent
Tsunami et al.

(10) Patent No.: US 9,048,295 B2
(45) Date of Patent: Jun. 2, 2015

(54) METHOD OF MANUFACTURING SEMICONDUCTOR DEVICE

(71) Applicant: Mitsubishi Electric Corporation, Tokyo (JP)

(72) Inventors: Daisuke Tsunami, Tokyo (JP); Koichiro Nishizawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/010,627

(22) Filed: Aug. 27, 2013

(65) Prior Publication Data
US 2014/0117549 A1    May 1, 2014

(30) Foreign Application Priority Data

Oct. 30, 2012 (JP) .................................. 2012-239106
Apr. 8, 2013 (JP) .................................. 2013-080609

(51) Int. Cl.
*H01L 21/31* (2006.01)
*H01L 21/768* (2006.01)

(52) U.S. Cl.
CPC ............................... *H01L 21/76874* (2013.01)

(58) Field of Classification Search
CPC ................ H01L 21/316; H01L 21/312; H01L 21/76801
USPC .......................................... 438/453, 782, 784
See application file for complete search history.

(56) References Cited

U.S. PATENT DOCUMENTS

| 5,668,411 A | 9/1997 | Hong et al. |
| 6,268,619 B1 | 7/2001 | Kosaki et al. |
| 6,627,542 B1 | 9/2003 | Gandikota et al. |
| 7,078,796 B2 * | 7/2006 | Dunn et al. .................. 257/690 |
| 8,158,507 B2 | 4/2012 | Nishizawa |
| 2002/0127790 A1 | 9/2002 | Hongo et al. |
| 2003/0010645 A1 | 1/2003 | Ting |
| 2008/0286538 A1 | 11/2008 | Yokozawa et al. |
| 2009/0242411 A1 * | 10/2009 | Yokozawa et al. ............. 205/125 |
| 2010/0279012 A1 | 11/2010 | Sato |

FOREIGN PATENT DOCUMENTS

| CN | 1910041 A | 2/2007 |
| JP | 2000-294518 A | 10/2000 |

(Continued)

OTHER PUBLICATIONS

Japanese Patent Office; Office Action in Japanese Patent Application No. 2013-080609 dated Jul. 15, 2014.

(Continued)

*Primary Examiner* — Quoc Hoang
(74) *Attorney, Agent, or Firm* — Leydig, Voit & Mayer, Ltd.

(57) ABSTRACT

A method of manufacturing a semiconductor device includes the steps of immersing a substrate in a solution containing metal ions to adhere a metal catalyst to a surface of the substrate, immersing the substrate with the metal catalyst adhered thereto in an electroless plating solution to electrolessly plate a layer on the substrate, immersing the substrate in an electroplating solution to electroplate a layer on the electrolessly plated layer using the electrolessly plated layer as a power feeding layer, and forming a metal layer of Cu or Ag on the electroplated layer. The electroplated layer is formed of a different material than the metal layer.

12 Claims, 10 Drawing Sheets

(56) References Cited

FOREIGN PATENT DOCUMENTS

| | | | |
|---|---|---|---|
| JP | 2001-144089 A | 5/2001 |
| JP | 2002-285343 A | 10/2002 |
| JP | 2004-119723 A | 4/2004 |
| JP | 2004-533123 A | 10/2004 |
| JP | 2005-336600 A | 12/2005 |
| JP | 2007-157883 A | 6/2007 |
| JP | 2009-174041 A | 8/2009 |
| JP | 2011-165810 A | 8/2011 |
| KR | 1996-0035840 A1 | 10/1996 |
| KR | 1999-004578 A1 | 1/1999 |
| KR | 2001-0029929 A | 4/2001 |
| KR | 10-2005-0077861 A | 8/2005 |

OTHER PUBLICATIONS

Chen, Chang-You et al.; "Backside Copper Metallization of GaAs MESFETs Using TaN as the Diffusion Barrier", *IEEE Transactions on Electron Devices*, vol. 48, No. 6, (Jun. 2001), pp. 1033-1036.

Chang, Chun-Wei, et al.; "Mechanism of Microstructure Evolution for the Cu/Ta/GaAs Structure after Thermal Annealing", *Japanese J. of Applied Physics*, vol. 46, No. 4A, (2007), pp. 1409-1414.

Korean Intellectual Property Office; Office Action in Korean Patent Application No. 10-2013-0100888 dated Oct. 20, 2014.

Korean Patent Office; Office Action in Korean Patent Application No. 10-2013-0100888 (Feb. 3, 2015).

Taiwan Patent Office; Office Action in Taiwanese Patent Application No. 10420124930 (Jan. 28, 2015).

\* cited by examiner

METHOD OF MANUFACTURING SEMICONDUCTOR DEVICE

BACKGROUND OF THE INVENTION

1. Field of the Invention

The present invention relates to a method of manufacturing a semiconductor device wherein a metal functioning as a radiator or an electrode is formed on a substrate, and also relates to semiconductor devices manufactured by this manufacturing method.

2. Background Art

Chun-Wei CHANG et al. (JJAP Vol. 46, No. 4A, 2007, pp. 1409-1414) discloses a semiconductor device in which a Cu diffusion blocking layer is formed between a substrate and an overlying Cu layer by a vacuum film-forming method such as vacuum deposition. The vacuum film-forming method can be used to form films of various metals. For example, a Cu diffusion blocking layer may be formed of Ta by a vacuum film-forming method so as to achieve enhanced Cu diffusion blocking effect.

Japanese Laid-Open Patent Publication No. 2011-165810 discloses a technique for forming a Pd plating layer on a GaAs substrate by means of electroless plating. This publication also discloses that a metal layer of Cu, etc. may be formed on the Pd plating layer.

A Cu diffusion blocking layer formed by a vacuum film-forming method as disclosed by Chun-Wei CHANG et al. above tends to exhibit inadequate covering ability (or coverage ratio), since vacuum film-forming techniques are anisotropic. It has been found, particularly, that vacuum film-forming methods cannot form a film having high covering ability on substrates having a projection or recess. If a Cu diffusion blocking layer formed on a substrate has low covering ability, a portion of the Cu layer overlying the Cu diffusion blocking layer will be in direct contact with the substrate, so that Cu in the Cu layer diffuses through that portion into the substrate.

The technique disclosed in the above patent publication has been found disadvantageous in that the Pd plating layer formed by electroless plating does not have adequate Cu diffusion blocking effect, with the result that Cu in the metal layer diffuses into the substrate and thereby affects the characteristics of the semiconductor device.

SUMMARY OF THE INVENTION

The present invention has been made to solve the above problems. It is, therefore, an object of the present invention to provide a method of manufacturing a semiconductor device in which a layer formed between a substrate and a metal layer has high covering ability and serves to reduce diffusion of components of the metal layer, such as Cu, into the substrate. Another object of the invention is to provide such a semiconductor device.

The features and advantages of the present invention may be summarized as follows.

According to one aspect of the present invention, a method of manufacturing a semiconductor device, includes the steps of immersing a substrate in a solution containing metal ions to adhere a metal catalyst to a surface of the substrate, immersing the substrate with the metal catalyst adhered thereto in an electroless plating solution to electrolessly plate a layer on the substrate, immersing the substrate in an electroplating solution to electroplate a layer on the electrolessly plated layer using the electrolessly plated layer as a power feeding layer, and forming a metal layer of Cu or Ag on the electroplated layer. The electroplated layer is formed of a different material than the metal layer.

According to another aspect of the present invention, a semiconductor device includes a substrate, a first metal layer formed on the substrate, a second metal layer formed on the first metal layer, and a metal layer of Cu or Ag formed on the second metal layer. The second metal layer has a larger crystal grain size than the first metal layer.

According to another aspect of the present invention, a method of manufacturing a semiconductor device, includes the steps of immersing a substrate in a solution containing metal ions to adhere a metal catalyst to a surface of the substrate, immersing the substrate with the metal catalyst adhered thereto in an electroless plating solution to electrolessly plate a layer on the substrate, plating an Au layer on the electrolessly plated layer, immersing the substrate in an electroplating solution to electroplate a layer on the plated Au layer using the electrolessly plated layer and the plated Au layer as power feeding layers, and forming a metal layer of Cu or Ag on the electroplated layer. The electroplated layer is formed of a different material than the metal layer.

Other and further objects, features and advantages of the invention will appear more fully from the following description.

DETAILED DESCRIPTION OF THE PREFERRED EMBODIMENTS

Methods of manufacturing a semiconductor device, and semiconductor devices, in accordance with embodiments of the present invention will be described with reference to the accompanying drawings. Throughout the specification the same or corresponding components are designated by the same reference symbols and may be described only once.

First Embodiment

Figure 1:
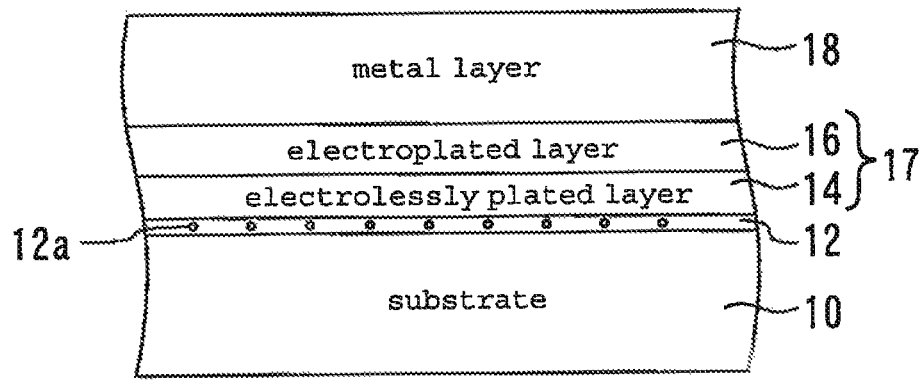
FIG. 1 is a cross-sectional view of a semiconductor device in accordance with a first embodiment of the present invention.

FIG. 1 is a cross-sectional view of a semiconductor device in accordance with a first embodiment of the present invention. This semiconductor device includes a substrate 10 formed of GaAs. A Pd—Ga—As layer 12 is formed on the substrate 10. Further, a first metal layer is formed on the substrate 10, with the Pd—Ga—As layer 12 interposed therebetween. The first metal layer is formed of NiP material by electroless plating and hence referred to herein as the electrolessly plated layer 14.

A second metal layer is formed on the first metal layer (or electrolessly plated layer 14). The second metal layer is formed by electroplating and hence referred to herein as the electroplated layer 16. In this example, the electroplated layer 16 is formed of Pd. However, it may be formed of Ru, Pt, or Rh instead of Pd. Further, the second metal layer (or electroplated layer 16) has a larger crystal grain size than the first metal layer (or electrolessly plated layer 14). The electrolessly plated layer 14 and the electroplated layer 16 may be hereinafter referred to collectively as the diffusion blocking layer 17. It should be noted that an Au layer may be plated on the first metal layer, and the second metal layer may be formed on this plated Au layer. Thus, the plated Au layer is interposed between the first metal layer and the second metal layer. This prevents cracking of the second metal layer, and furthermore the second metal layer is adhered to the first metal layer by the plated Au layer. The plated Au layer may be produced using any type of plating solution including, but not limited to, a displacement Au plating solution. Further, the plated Au layer may have a thickness of, e.g., approximately 50 nm, or less.

A metal layer 18 of Cu is formed on the second metal layer (or electroplated layer 16). The metal layer 18 has a thickness of, e.g., approximately 1-5 μm. The Pd—Ga—As layer 12, the electrolessly plated layer 14, the electroplated layer 16, and the metal layer 18 serve to enhance the heat dissipation from the semiconductor device and to provide electrical contact. The metal layer 18 is preferably formed to have a greater thickness than the other layers (i.e., the Pd—Ga—As layer 12, the electrolessly plated layer 14, and the electroplated layer 16), since the metal layer 18 is formed of Cu and hence has relatively good heat dissipation characteristics and low electrical resistivity.

A method of manufacturing a semiconductor device in accordance with the first embodiment will be described. First, a substrate 10 is immersed in a solution containing metal ions so as to adhere a metal catalyst to the surface of the substrate 10. The metal ion-containing solution is a Pd activating solution containing Pd ions, such as a palladium chloride solution. The Pd activating solution has a Pd concentration of, e.g., approximately 0.1-1.0 g/L. The substrate 10 is immersed in the Pd activating solution at 20-30° C. for approximately 1-5 minutes while the Pd activating solution is stirred so that a metal catalyst adheres to the surface of the substrate 10. The metal catalyst (i.e., Pd catalyst) then reacts with components of the substrate 10, forming a Pd—Ga—As layer 12. The Pd—Ga—As layer 12 thus formed contains a metal catalyst 12a.

Since the Pd concentration and temperature of the Pd activating solution affects the amount and uniformity of Pd catalyst that adheres to the substrate 10, it is necessary to adjust these parameters of the Pd activating solution so that the interface between the substrate 10 and the Pd—Ga—As layer 12 has adequate adhesion, thereby preventing delamination of the Pd—Ga—As layer 12, and so that the Pd—Ga—As layer 12 has appropriate surface morphology.

Next, the substrate 10 with the metal catalyst adhered thereto is immersed in an electroless plating solution so as to produce an electrolessly plated layer 14. The electroless plating solution may be, e.g., a nickel sulfate solution containing sodium hypophosphite as a reducing agent and an organic acid as a complexing agent. This solution has a Ni concentration of approximately 1-1.5 g/L. The P concentration of the solution may be adjusted so that the electrolessly plated layer 14 has a P content of approximately 8-10%. Such an electrolessly plated Ni layer has higher corrosion resistance than a pure Ni layer. The electroless plating solution is set at a temperature of 60-80° C. and stirred during the immersion of the substrate 10 in the electroless plating solution.

Next, the substrate 10 is immersed in an electroplating solution, and a layer 16 of Pd is electroplated on the electrolessly plated layer 14 using the electrolessly plated layer 14 as a power feeding layer (i.e., by supplying electricity through the electrolessly plated layer 14). Specifically, the substrate 10 is immersed in an electroplating solution, and a DC power supply is connected to the substrate 10 and a separate platinum-coated titanium electrode (which is also immersed in the electroplating solution) so that the electrolessly plated layer 14 acts as a cathode and the titanium electrode acts as an anode. A current is then applied between the cathode (the electrolessly plated layer 14) and the anode (the titanium electrode) so as to effect electroplating of the electrolessly plated layer 14 with Pd. The electroplating solution is, e.g., a solution containing a palladium salt, such as diamminedichloropalladium(II) [PdCl$_2$(NH$_3$)$_2$], and a conductive salt, such as NH$_4$Cl. The Pd concentration of the solution is, e.g., approximately 0.1-0.5%. The electroplating solution is set at a temperature of 40-60° C. during the immersion of the substrate 10 in the electroplating solution. It should be noted that the electroplated layer 16 is formed of Pd and a metal layer 18 that is subsequently formed on the electroplated layer 16 is formed of Cu; that is, they are made of different materials.

Next, the metal layer 18 of Cu is formed on the electroplated layer 16. Specifically, the substrate 10 is immersed in a Cu plating solution, and a DC power supply is connected to the substrate 10 and a separate phosphor copper electrode (which is also immersed in the Cu plating solution) so that the electroplated layer 16 acts as a cathode and the phosphor copper electrode acts as an anode. A current is then applied between the cathode (the electroplated layer 16) and the anode (the phosphor copper electrode) to effect electroplating of the electroplated layer 16 with Cu. The Cu plating solution is, e.g., a solution containing copper sulfate, sulfuric acid, chlorine ions, and/or organic additive agents. When chlorine ions are used, hydrochloric acid may be added to the plating bath to adjust the chlorine ion concentration.

If Cu in the Cu metal layer 18 enters the substrate 10 of GaAs, the Cu diffuses in the substrate 10 at a high rate even at low temperatures and furthermore forms a deep acceptor level in the substrate 10. This means that the diffusion of Cu into the substrate 10 results in unstable characteristics of the semiconductor device. In order to prevent the diffusion of Cu into the substrate 10, the semiconductor device of the first embodiment includes the diffusion blocking layer 17 formed between the substrate 10 and the metal layer 18.

The diffusion blocking layer 17 is required to have "high covering ability" so as to be able to completely fill the interface between the metal layer 18 and the substrate 10 and is also required to be "of such a film quality as to have a significant diffusion blocking effect." The following describes the high covering ability of the diffusion blocking layer 17 of the first embodiment.

Figures 2A, 2B:
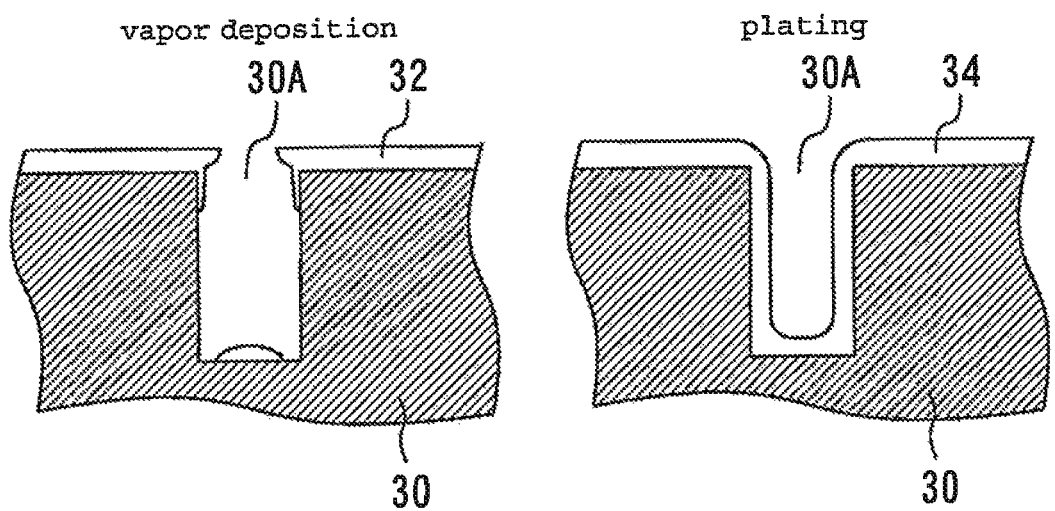
FIGS. 2A and 2B are cross-sectional views illustrating the difference in covering ability by layers formed by vapor deposition and plating, respectively.

FIGS. 2A and 2B are cross-sectional views illustrating the difference in covering ability by layers formed by vapor deposition and plating, respectively. Specifically, FIG. 2A is a cross-sectional view of a layer 32 formed by vapor deposition on a substrate 30 having an opening 30A. FIG. 2B is a cross-sectional view of a layer 34 formed by plating on the same substrate 30 having the opening 30A. A comparison of FIGS. 2A and 2B indicates that the layer 34 formed by plating has higher covering ability than the layer 32 formed by vapor deposition. More specifically, the deposited layer 32 fails to fully cover the side wall of the opening 30A, whereas the plated layer 34 completely covers the walls of the opening 30A (i.e., exhibits high covering ability).

Thus, plating is a film-forming method capable of forming a film having high covering ability, as compared with other film-forming methods such as vapor deposition, sputtering, CVD, and ion plating. Since the diffusion blocking layer 17 of the first embodiment is made up of the electrolessly plated layer 14 and the electroplated layer 16, which are produced by plating, the diffusion blocking layer 17 has high covering ability. Therefore, the diffusion blocking layer 17 can be formed to completely fill the interface between the metal layer 18 and the substrate 10.

Attention is now directed to the fact that the diffusion blocking layer 17 is of such a film quality as to have a significant diffusion blocking effect. Copper (Cu) in the metal layer 18 migrates to the diffusion blocking layer 17 and diffuses therein primarily via grain boundary diffusion. Therefore, the diffusion blocking layer 17 is preferably amorphous, which means that it has no grain boundaries. However, as a result of the present inventor's intensive study, it has been found that, although the electrolessly plated layer 14 of the diffusion blocking layer 17 is amorphous, hence has no grain boundaries, and is capable of preventing grain boundary diffusion immediately after its formation, the electrolessly plated layer 14 transforms into a fine crystalline form when later subjected to heat treatment, e.g., at approximately 200° C.

Figure 3A:
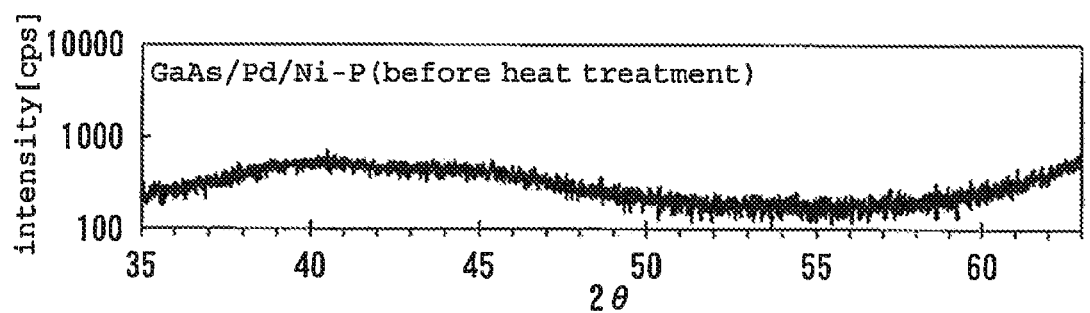
FIGS. 3A and 3B are graphs illustrating fine crystallization of an electrolessly plated layers in response to heating.
Figure 3B:
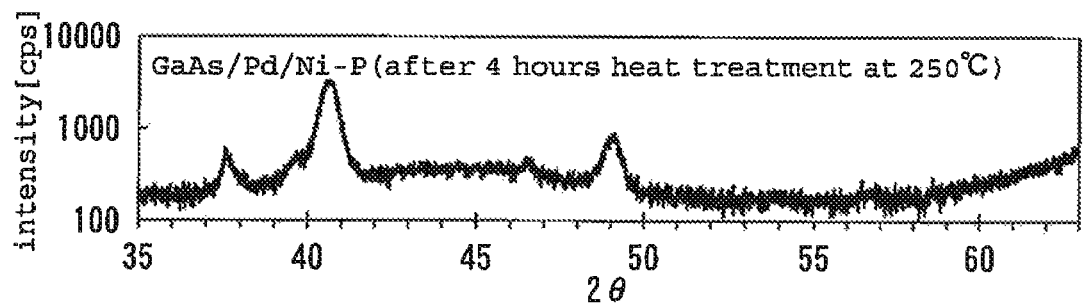

FIGS. 3A and 3B are graphs illustrating fine crystallization of an electrolessly plated layer in response to heating. Specifically, FIG. 3A shows x-ray diffraction results of a sample before it was subjected to heat treatment. This sample was produced by electrolessly plating a layer of Pd on a GaAs substrate to a thickness of 300 nm and then further electrolessly plating a layer of NiP on the electrolessly plated Pd layer to a thickness of 100 nm. The diffraction peak shown in FIG. 3A is broad, indicating that the sample (made up of two electrolessly plated layers, as described above) was amorphous immediately after its formation.

FIG. 3B shows x-ray diffraction results of the sample after it was subjected to heat treatment at 250° C. for 4 hours. The x-ray diffraction results of FIG. 3B exhibit a plurality of peaks, indicating crystallization of the sample (made up of two electrolessly plated layers). It follows from these x-ray diffraction results of the sample that the electrolessly plated layer 14 of the present embodiment transforms into an aggregate of small-sized crystal grains when subjected to heat treatment and hence has many grain boundaries after the heat treatment, resulting in a decreased Cu diffusion blocking effect.

In contrast, the electroplated layer 16, which is produced by electroplating, has a larger crystal grain size than the electrolessly plated layer 14. Therefore, the electroplated layer 16 has fewer grain boundaries and hence a higher Cu diffusion blocking effect than the electrolessly plated layer 14. Further, it is possible to minimize the diffusion of atoms from the electroplated layer 16 into adjacent layers when the electroplated layer 16 is heat treated, since the electroplated layer 16 has relatively few grain boundaries. Thus, the electroplated layer 16 has high thermal stability, resulting in an enhanced Cu diffusion blocking effect of the diffusion blocking layer 17. In other words, the diffusion blocking layer 17 is of such a film quality as to have a significant diffusion blocking effect, since it includes the electroplated layer 16.

As described above, the Cu diffusion blocking effect of the electrolessly plated layer 14 is relatively small, since it includes many grain boundaries. However, the electrolessly plated layer 14 serves as a power feeding layer when forming the electroplated layer 16. That is, since the substrate 10 has low conductivity, it is not possible to directly electroplate a layer on the substrate 10. Therefore, the electrolessly plated layer 14 is provided on the substrate 10 and used as a power feeding layer for forming the electroplated layer 16. Further, the electrolessly plated layer 14 also serves as an adhesion layer for enhancing the adhesion between the substrate 10 and the metal layer 18.

Figure 4:
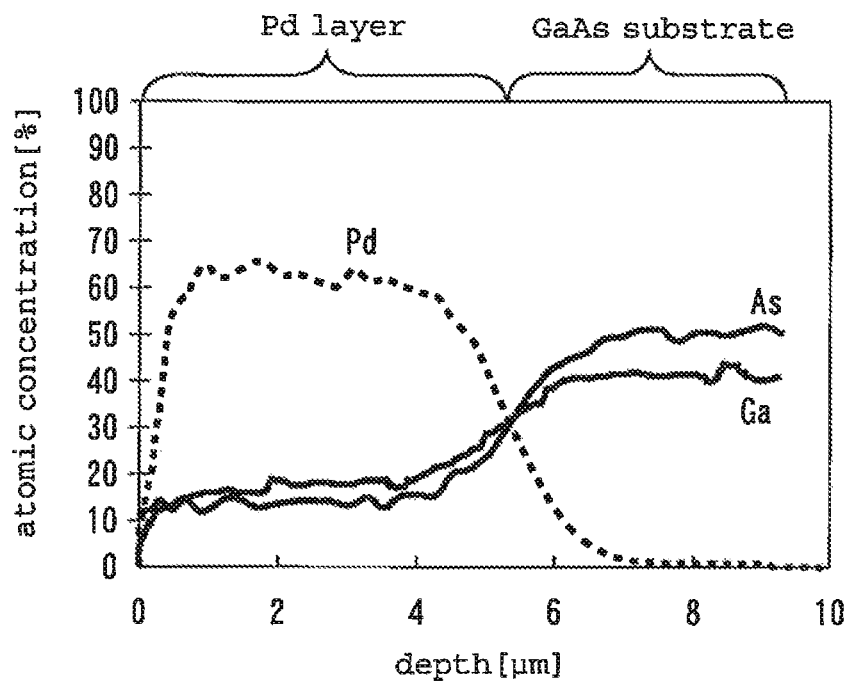
FIG. 4 is a graph showing alloying of an electrolessly plated layer of Pd.

It should be noted that since the Pd—Ga—As layer 12, which separates the electrolessly plated layer 14 from the substrate 10, is very thin, components of the electrolessly plated layer 14 may mix with those of the substrate 10 due to heat treatment so as to form an alloy. FIG. 4 is a graph showing alloying of an electrolessly plated layer of Pd. This sample (or electrolessly plated layer) was produced by electrolessly plating a layer of Pd on a GaAs substrate to a thickness of 100 nm and then heat-treating the layer in a nitrogen atmosphere at 250° C. for 4 hours. An elemental depth profile of this sample was obtained using depth Auger electron spectroscopy.

As can be seen from FIG. 4, electrolessly plating a layer of Pd on a GaAs substrate tends to result in formation of an alloy of Pd and GaAs, since GaAs will diffuse into the electrolessly plated Pd layer. In order to avoid this, the electrolessly plated layer 14 is preferably formed of NiP if the substrate 10 is GaAs.

Figure 5:
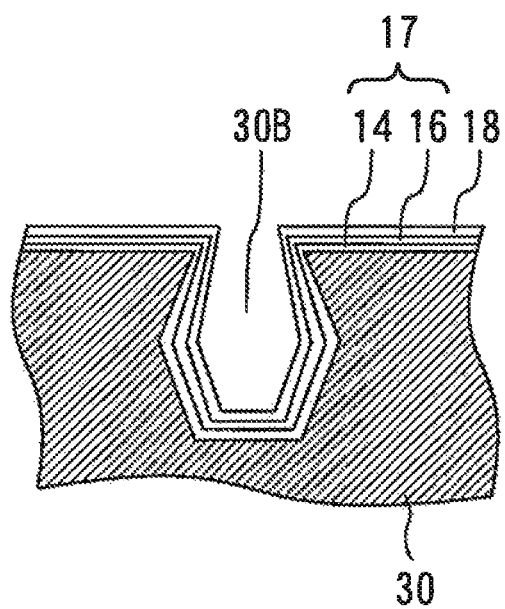
FIG. 5 is a cross-sectional view of a semiconductor device having a substrate with a recess formed therein.
Figure 6:
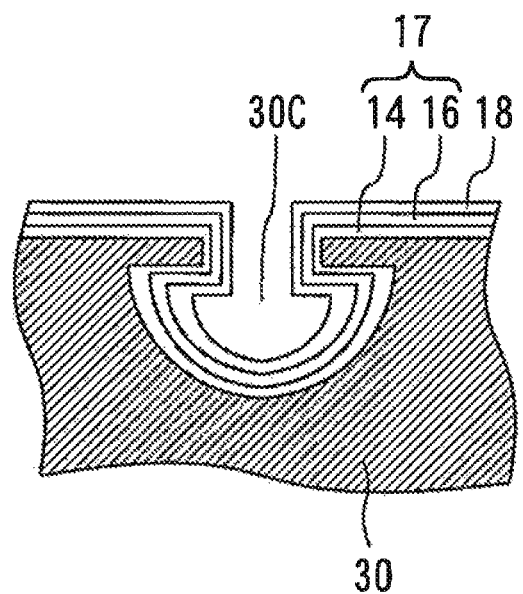
FIG. 6 is a cross-sectional view of a semiconductor device having a substrate with a recess formed therein.
Figure 7:
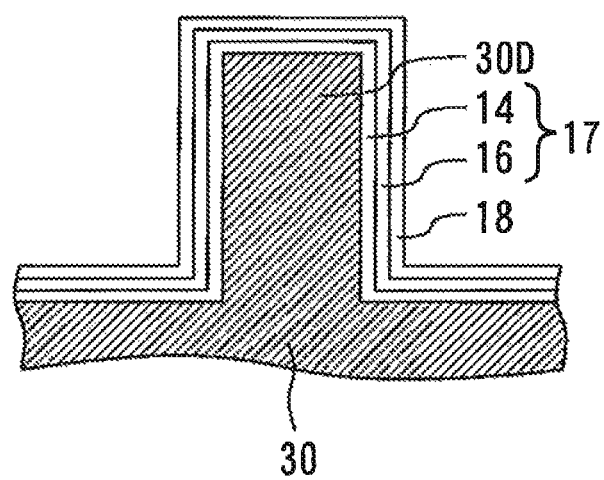
FIG. 7 is a cross-sectional view of a semiconductor device having a substrate with a projection formed thereon.
Figure 8:
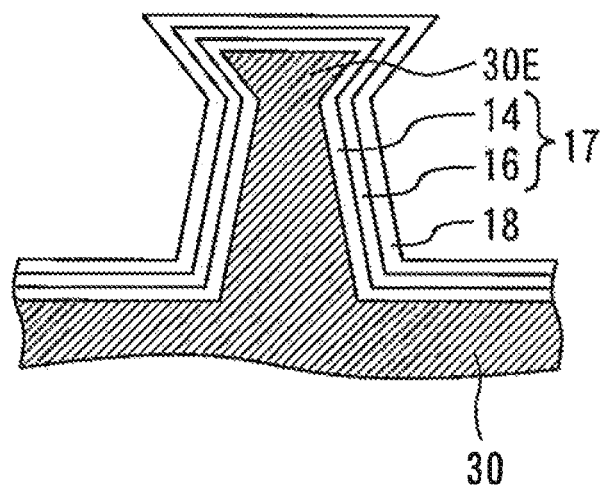
FIG. 8 is a cross-sectional view of a semiconductor device having a substrate with a projection formed thereon.
Figure 9:
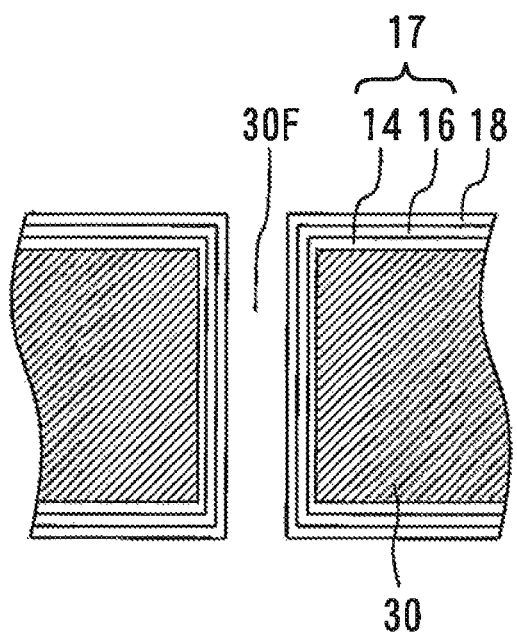
FIG. 9 is a cross-sectional view of a semiconductor device having a substrate with a through-hole formed therein.

Although the substrate 10 of the semiconductor device of the first embodiment has a flat surface, it is to be understood that the present invention is not limited to this type of substrate. In other embodiments, the substrate 10 may have a recess, projection, or through-hole in its surface. FIG. 5 is a cross-sectional view of a semiconductor device having a substrate 30 with a recess 30B formed therein. FIG. 6 is a cross-sectional view of a semiconductor device having a substrate 30 with a recess 30C formed therein. FIG. 7 is a cross-sectional view of a semiconductor device having a substrate 30 with a projection 30D formed thereon. FIG. 8 is a cross-sectional view of a semiconductor device having a substrate 30 with a projection 30E formed thereon. FIG. 9 is a cross-sectional view of a semiconductor device having a substrate 30 with a through-hole 30F formed therein.

When a recess, projection, or through-hole is to be formed in the surface of a substrate, it is produced by dry etching, such as reactive ion etching or plasma etching, or by wet etching in acid or alkali. However, wet etching is particularly likely to cause side etching, or undercut. Further, certain wet etching solutions exhibit a difference in etching rate between different crystal plane orientations and between different crystal materials of the object to be etched, thereby etching the object into a mesa or inverted mesa shape.

In such cases, it is difficult to form a uniform layer over the object by use of a film-forming technique having anisotropic tendency, such as vapor deposition. In the semiconductor device manufacturing method of the first embodiment, on the other hand, the diffusion blocking layer 17 is formed by plating and hence exhibits high covering ability even if the surface of the substrate is provided with a recess, projection, or through-hole.

In the present embodiment, the metal layer 18 is formed of Cu and hence is low-cost, as compared to layers formed of noble metals such as Au. However, the metal layer 18 may be formed of Ag instead of Cu. Since Ag has higher electrical and thermal conductivity than any other metal, if the metal layer 18 is formed of Ag, the semiconductor device can be manufactured to have high electrical conductivity and good heat dissipation characteristics. It should be noted that the metal layer 18 may be formed using any suitable method such as vapor deposition, sputtering, or plating, whether it is formed of Cu or Ag. It should be noted that when a layer of Cu (such as the metal layer 18) is formed on a substrate having a recess, Cu may be grown or deposited selectively in the recess relative to flat portions of the substrate so as to fill the recess. This is preferably achieved by an electroplating method. The plating solution used is a copper sulfate plating bath containing, e.g., sulfuric acid, chlorine ions, and organic additive agents. These additive agents include an accelerating agent (an accelerator or brightener), a suppressing agent (a suppressor or carrier), or a leveling agent (or leveler).

When the surface of the substrate 10 exhibits poor wettability, the substrate 10 may be subjected to pretreatment such as oxygen ashing or ozone ashing before a metal catalyst is adhered to the surface of the substrate 10. Further, in order to enhance the adhesion between the diffusion blocking layer 17 and the substrate 10, the substrate 10 may be cleaned in an acid or alkali solution having the effect of removing surface oxide films. Specifically, hydrofluoric acid-based solution treatment is preferably used to remove surface oxide films from Si and SiC substrates, and hydrochloric acid-based solution treatment is preferably applied to remove surface oxide films from GaAs and GaN substrates. Further, sulfuric acid-based or hydrofluoric acid-based solution treatment is preferably applied to InP substrates.

The electrolessly plated layer 14 may be formed of an elemental metal, such as Ni, Co, Pd, Cu, Ag, Au, Pt, Sn, Ru, or Rh, or an alloy, such as NiB, NiCoWP, NiMoP, CoP, CoNiP, CoWP, CoSnP, CoZnP, or CoMnP. Alloy plating has different properties than elemental metal plating; for example, alloy plating provides enhanced corrosion resistance.

Electroless plating solutions comprise a metal salt, a reducing agent, a buffering agent, a complexing agent, and a fixing agent, etc. In the case of electroless Ni plating solutions, examples of metal salts include nickel sulfate, nickel chloride, nickel acetate, nickel carbonate, nickel sulfamate, and other nickel salts; examples of reducing agents include sodium phosphinate ($NaH_2PO_2 \cdot H_2O$) and dimethylamine borane (DMAB); examples of buffering agents include monocarboxylic acids (such as formic acid and acetic acid) and alkali metal salts thereof; and examples of complexing agents includes organic acids (such as citric acid), ethylenediamine tetraacetic acid (EDTA), and ammonia, etc.

Electroless Pd plating solutions are often prepared using a palladium chloride (a palladium salt). The reducing agent used is typically ethylenediamine tetraacetic acid (EDTA) used together with a phosphinate serving as a complexing agent.

Electroless Au plating solutions are broadly divided into two types: displacement Au plating solutions, which are used for displacement plating of a substrate metal surface with Au; and autocatalytic Au plating solutions, which contain a reducing agent for depositing a gold film. Displacement Au plating solutions are prepared using sodium gold sulfite with the addition of complexing agents such as a sulfite salt, mercaptosuccinic acid, and ethylenediamine tetraacetic acid (EDTA). A chelating agent may be added to the solutions to fix metal ions during plating. Any suitable type of water-soluble chelating agent may be used; typical examples of such chelating agents include thallium compounds such as thallium sulfate, thallium nitrate, thallium oxide, thallium chloride, and thallium malonate.

Autocatalytic Au plating solutions are used in a strongly alkaline bath and prepared using a gold cyanide complex, such as gold(I) potassium cyanide ($KAu(CN)_2$) or gold(II) potassium cyanide ($KAu(CN)_4$), with the addition of potassium tetrahydroborate or dimethylamine borane (DMAB) as a reducing agent.

In current practice, electroless Cu plating solutions are prepared using copper sulfate as a metal salt for supplying copper ions, with the addition of a reducing agent. A typical example of a reducing agent is formaldehyde. Other examples of reducing agents include potassium tetrahydroborate, dimethylamine borane, and glyoxylic acid. Further, in order to increase the plating rate, the plating bath is made strongly alkaline. Examples of PH control agents include sodium hydroxide, potassium hydroxide, and lithium hydroxide.

In strongly alkaline plating baths for electroless Cu plating, copper ions tend to be precipitated as hydroxide. Examples of complexing agents for preventing such precipitation include Rochelle salt, EDTA, glycerol, meso-erythritol, adonitol, D-mannitol, D-sorbitol, dulcitol, iminodiacetic acid, trans-1, 2-cyclohexanediamine tetraacetic acid, triethanolamine, and ethylenediamine. A decrease in the stability of the bath, e.g., decomposition of the plating solution, is caused primarily by copper powder in the solution, which powder is generated by disproportionation reaction of $CuO_2$ ($CuO2+H2O \rightarrow Cu+ Cu2++2OH—$). Methods for avoiding this problem include agitation of the plating solution by air and addition of a fixing agent to the bath.

Examples of fixing agents include cyanide, thiourea, bipyridyl, o-phenanthroline, and neocuproine, which form a complex preferentially with monovalent copper. An accelerating agent such as 8-hydroxy-7-iodo-5-quinolinesulfonic acid is added to the plating bath to increase the plating rate without degrading the stability of the bath.

Electroless Pt plating solutions are prepared using a platinum salt, such as dinitrodiammine platinum or potassium tetranitro-platinate, a reducing agent, such as hydrazine, and a fixing agent, such as hydroxylamine salt.

Electroless Rh plating solutions are prepared using a rhodium salt, such as rhodium amine nitrite, rhodium chloride amine, ammonium di(pyridine-2,6-dicarboxylate) rhodium(III), rhodium acetate, or rhodium chloride, and a reducing agent, such as hydrazine or sodium tetrahydroborate. The plating solutions are used in a plating bath which is made alkaline by addition of ammonia, etc.

Electroless Ru plating solutions are prepared using a ruthenium salt, such as tetraamminediaquaruthenium phosphate or ruthenium sulfate, and a reducing agent, such as sodium tetrahydroborate. The plating solutions are used in a plating bath which is made alkaline by addition of ammonia, etc., or made acidic by addition of sulfuric acid, etc.

Electroless Co plating solutions are prepared using cobalt sulfate and sodium phosphinate as its principal components, with the addition of a complexing agent such as a citrate, tartrate, or pyrophosphate.

Examples of metals which can be electroplated include Zn, Ir, In, Cd, Au, Ag, Cr, Co, Sn, Fe, Cu, Pb, Ni, Pt, Pd, Bi, Mn, Mo, Rh, and Ru. Any suitable method can be used to produce the electroplated layer 16. Examples of such methods include DC plating, pulse plating, and reverse pulse plating. Electroplating solutions comprise a metal salt, an electrically conductive salt, an anode dissolution accelerating agent, a complexing agent, and additive agents, etc. It should be noted that when the substrate to be plated has a via structure, pulse plating or reverse pulse plating may be used to enhance the covering ability of the electroplated layer, as compared to the use of DC plating.

Nickel (Ni) electroplating solutions are used in an acidic bath such as a Watt bath, a chloride bath, a sulfamate bath, or a Wood's bath. The Watt bath contains nickel sulfate, nickel chloride, and boric acid, etc. The chloride bath contains nickel chloride and boric acid, etc. Further, the sulfamate bath contains nickel sulfamate, nickel chloride, and boric acid, etc. The Wood's bath contains nickel chloride and hydrochloric acid, etc.

Nickel electroplating solutions may contain an anode solubilzing agent, a PH buffering agent, or additive agents for reducing stress in electrodeposits or improving surface conditions. Examples of additive agents include primary brightening agents, such as saccharine, naphthalene sodium (di-, tri-) sulfonate, sulfonamide, and sulfinic acid, and secondary brightening agents, such as 1,4-butynediol and coumarin. Anodes used for nickel plating preferably have a high degree of purity and uniformly dissolve during plating without generation of anode slime. Examples of anode materials include electrolytic nickel, depolarized nickel, carbonized nickel, and sulfur-containing nickel.

In current practice, Pd electroplating solutions are prepared using diamminedichloropalladium(II) [$PdCl_2(NH_3)_2$] (a palladium salt), a conductive salt, and a pH buffering agent ($NH_4Cl$ or $K_2HPO_4$). They are used in a neutral or alkaline ammine complex bath. The anode used is an insoluble anode such as a platinum-coated titanium electrode. The bath may contain an organic compound, such as saccharine or 1,3,6-naphthalene trisulfonate, as a primary brightening agent, and may also contain another organic compound, such as coumarin, as a secondary brightening agent.

Ruthenium (Ru) electroplating solutions are prepared using ruthenium sulfate (a ruthenium salt) and used in a plating bath which is made acidic by addition of sulfamic acid, etc.

In current practice, Pt electroplating solutions are prepared using cis-dinitrodiamine platinum (a platinum salt), and used in a plating bath which is made neutral or acidic by addition of ammonium nitrite, sodium nitrite, or aqueous ammonia, etc.

Gold (Au) electroplating solutions are typically prepared so as to form a cyanide bath or a sulfurous acid bath. Exemplary such alkaline cyanide baths contain a gold salt, potassium gold(I) cyanide, potassium cyanide serving as a free-cyanide-ion source, potassium carbonate for enhancing electrodeposition, and dipotassium hydrogenphosphate serving as a pH buffering agent. Exemplary sulfurous acid baths, on the other hand, contain a gold salt, sodium gold(I) sulfite, sodium sulfite, and phosphorous acid and are adjusted to approximately pH8. In order to improve the quality of the plated Au film produced, these baths may contain a trace amount of a thallium compound and/or a trace amount of ethylene diamine, etc. serving as a fixing agent for reducing decomposition of gold(I) sulfite complex.

It should be noted that the additive concentration may be managed using a Hull cell test or cyclic voltammetric stripping (CVS), etc.

When the metal layer 18 is to be formed of Cu, a copper sulfate electroplating bath, a copper pyrophosphate electroplating bath, or a copper cyanide electroplating bath may be used. Copper sulfate baths are often used for the manufacture of semiconductor devices. Copper sulfate baths typically comprise $CuSO_4.5H_2O$, sulfuric acid, chlorine ions, and organic additive agents. These additive agents often include an accelerating agent (an accelerator or brightener), a suppressing agent (a suppressor or carrier), and/or a leveling agent (or leveler), especially when a via structure is to be filled with Cu.

In this case, the accelerating agent has the effect of promoting the growth, or deposition, of copper preferentially on the bottoms of the vias, and the suppressing agent adheres to the plated copper surface so as to suppress the growth of copper outside the vias. Further, the leveling agent acts on the suppressing agent so that the suppressing agent moves in the solution at a speed equal to the diffusion limitation, thereby suppressing the growth of copper outside the vias. Since these agents serve their functions with the aid of chlorine ions, it is important to control the concentration of chlorine ions, as well as those of the additive agents. Examples of suppressing agents include polyether compounds, typified by polyethylene glycol (PEG). Examples of accelerating agents include organic sulfur compounds having a sulfo group, typified by bis(3-sulfopropyl)disulfide (SPS). Examples of leveling agents include quaternary amine compounds, typified by Janus Green B (JGB).

The electroplating bath for forming the metal layer 18 is preferably maintained at approximately 20-30° C. The anode used is typically a soluble anode and is preferably made of high phosphorous copper in order to minimize generation of anode slime. The anode preferably has a phosphorous content of approximately 0.04-0.06%.

The material of the substrate 10 is not limited to GaAs. For example, the substrate 10 may be formed of Si, SiC, GaN, or InP instead of GaAs. Further, at least one epitaxial layer may be formed on the substrate 10, and the diffusion blocking layer 17 may be formed on the at least one epitaxial layer.

When the substrate 10 is formed of a compound semiconductor such as GaAs, the substrate 10 is highly reactive with the metal activating solution used, which facilitates adhesion between the substrate and the electrolessly plated layer formed thereon. When the substrate 10 is formed of Si-based material, on the other hand, it is difficult to ensure adhesion between the substrate 10 and the electrolessly plated layer 14, since the substrate 10 is poorly reactive with the metal activating solution. In order to overcome this problem, the substrate may be subjected to catalyst treatment using a metal activating solution containing buffered hydrofluoric acid after forming a silicon oxide film on the surface of the substrate (see Japanese Laid-Open Patent Publication No. 2005-336600).

The solution baths for storing the metal activating solution (Pd activating solution), the electroless plating solution, or the electroplating solution may be made of a material such as borosilicate glass which is resistant to high temperatures and to the formation of a film thereon, in order to minimize the formation of a film on the solution baths. If the substrate is held in a cassette while it is plated, then the cassette is preferably formed of a material having chemical resistance, such as a perfluoroalkoxy fluoroplastic (PFA). Further, the stirring bar used in the plating process and the handle used for holding the cassette may also be formed of a material having chemical resistance.

The above alterations to the semiconductor device manufacturing method and the semiconductor device of the first embodiment may also be made to the semiconductor device manufacturing methods and the semiconductor devices of the subsequently described embodiments.

Second Embodiment

Figure 10:
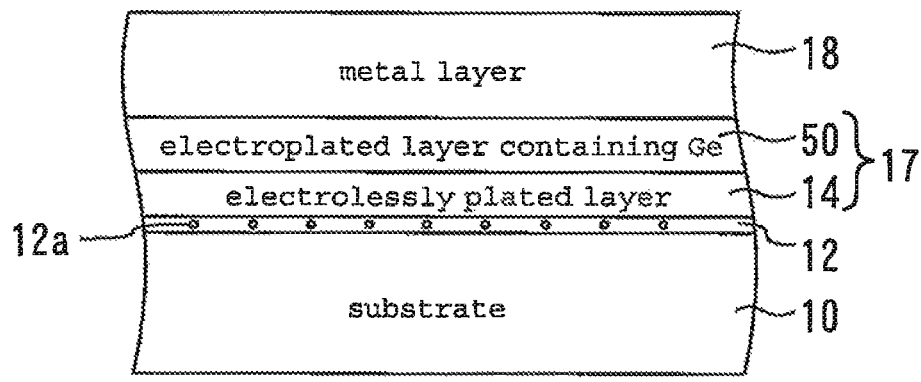
FIG. 10 is a cross-sectional view of the semiconductor device of the second embodiment.

A second embodiment of the present invention provides a method of manufacturing a semiconductor device and also provides a semiconductor device. These method and semiconductor device have many features common to the method and semiconductor device of the first embodiment. Therefore, the following description of the second embodiment will be primarily limited to the differences from the first embodiment. FIG. 10 is a cross-sectional view of the semiconductor device of the second embodiment. The semiconductor device includes an electroplated layer 50 which contains Ge.

The electroplated layer 50 is formed in an electroplating solution containing Ge oxide. The Ge oxide concentration of the electroplating solution is preferably 0.1-1000 mg/L in terms of Ge atom. The use of a Ge oxide-containing electroplating solution to produce the electroplated layer 50 results in co-deposition of the base metal (Pd) and Ge. The Ge concentration of the electroplated layer 50 is preferably in the range of from 1 ppm to 10000 ppm, inclusive.

Figure 11:
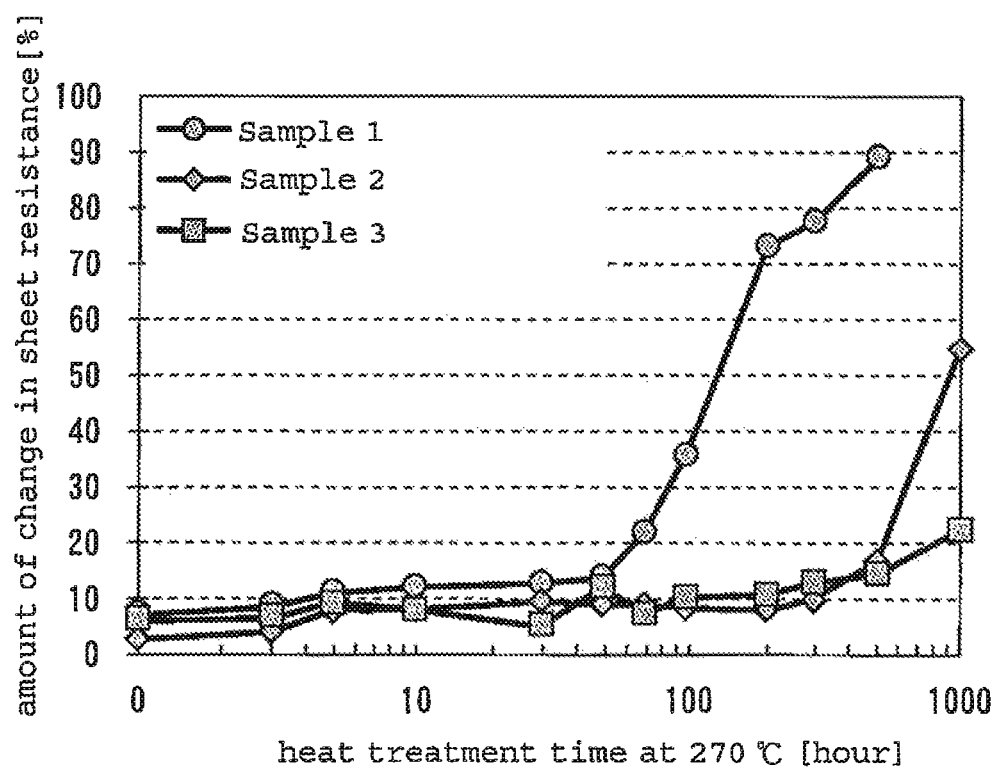
FIG. 11 is a graph comparing the Cu diffusion blocking effect of three different samples.

The advantages resulting from forming the Ge-containing electroplated layer will be described. FIG. 11 is a graph comparing the Cu diffusion blocking effect of three different samples. Sample 1 was produced as follows: a first NiP layer (having a thickness of 0.5 μm) was formed on a GaAs substrate in an electroless plating solution after applying catalyst treatment to the surface of the substrate using a Pd activating solution; a first Pd layer (0.2 μm) was then formed on the first NiP layer in an electroless plating solution; a Cu layer (a metal layer having a thickness of 3 μm) was then formed on the first Pd layer in an electroplating solution; a second NiP layer (0.5 μm) was then formed on the Cu layer in an electroless plating solution; a second Pd layer (0.2 μm) was then formed on the second NiP layer in an electroless plating solution; and an Au layer (0.05 μm) was then formed on the second Pd layer in a displacement plating solution. Thus, the diffusion blocking layer of Sample 1 (between the GaAs substrate and the Cu layer) includes only electrolessly plated layers.

Sample 2 was produced as follows: a first NiP layer (0.5 μm) was formed on a GaAs substrate in an electroless plating solution after applying catalyst treatment to the surface of the substrate using a Pd activating solution; a first Pd layer (0.2 μm) was then formed on the first NiP layer in an electroplating solution; a Cu layer (a metal layer having a thickness of 3 μm) was then formed on the first Pd layer in an electroplating solution; a second NiP layer (0.5 μm) was then formed on the Cu layer in an electroless plating solution; a second Pd layer (0.2 μm) was then formed on the second NiP layer in an electroplating solution; and an Au layer was then formed on the second Pd layer in a displacement plating solution. Thus, the diffusion blocking layer of Sample 2 (between the GaAs substrate and the Cu layer) includes an electrolessly plated layer and an electroplated layer.

Sample 3 was produced as follows: a first NiP layer (0.5 μm) was formed on a GaAs substrate in an electroless plating solution after applying catalyst treatment to the surface of the substrate using a Pd activating solution; a first Pd layer (0.2 μm) was then formed on the first NiP layer in an electroplating solution containing Ge oxide; a Cu layer (a metal layer having a thickness of 3 μm) was then formed on the first Pd layer in an electroplating solution; a second NiP layer (0.5 μm) was then formed on the Cu layer in an electroless plating solution; a second Pd layer (0.2 μm) was then formed on the second NiP layer in an electroplating solution; and an Au layer was then formed on the second Pd layer in a displacement plating solution. Thus, the diffusion blocking layer of Sample 3 (between the GaAs substrate and the Cu layer) includes an electroplated layer containing Ge.

Samples 1 to 3 have a multilayer structure including GaAs/NiP/Pd/Cu/NiP/Pd/Au layers (where the layer or layers on the right side of each symbol "I" overlie the layer or layers on the left side of the symbol). Specifically, in Sample 1, the NiP layer and the Pd layer that are disposed between the GaAs substrate and the Cu layer are electrolessly plated layers. In Sample 2, the NiP layer and the Pd layer that are disposed between the GaAs substrate and the Cu layer are an electrolessly plated layer and an electroplated layer, respectively. Sample 3 is similar in composition to Sample 2, except that the Pd layer between the substrate and the Cu layer contains Ge.

These samples are heat treated, and the amount of change in sheet resistance of each sample due to heat treatment was measured and plotted against heat treatment time. In FIG. 11, the vertical axis represents the amount of increase or change in sheet resistance of each sample due to heat treatment, expressed in percentage of the sheet resistance of the sample before the heat treatment, that is, [(the sheet resistance of each sample after heat treatment/that of the sample before the heat treatment)−1]×100(%); and the horizontal axis represents heat treatment time. The amount of change in sheet resistance of each sample due to heat treatment is dependent primarily on the amount of change in resistance of the metal layer of the sample due to the heat treatment, since the metal layer has a relatively large thickness of 3 μm and relatively low resistivity. If Cu in the metal layer diffuses into the GaAs substrate due to heat treatment, the thickness of the metal layer decreases, resulting in increased sheet resistance. This means that a decrease in the diffusion blocking effect of the diffusion blocking layer results in an increase in the sheet resistance. Therefore, in order to reduce the amount of change in sheet resistance of each sample due to heat treatment, it is necessary to increase the diffusion blocking effect of the diffusion blocking layer.

As can be seen from FIG. 11, the amount of change in sheet resistance of Sample 1 due to heat treatment rapidly increased as the heat treatment time was increased beyond approximately 60 hours, and the amount of change in sheet resistance of Sample 2 due to heat treatment rapidly increased as the heat treatment time was increased beyond approximately 500 hours. This means that the diffusion blocking effect of the diffusion blocking layers of these samples is inadequate. It should be noted that observation of Samples 1 and 2 under a scanning electron microscope (SEM) after the rapid increase in their sheet resistance revealed that the metal layers (Cu layers) of both samples had decreased in thickness.

On the other hand, the amount of change in sheet resistance of Sample 3 due to heat treatment did not rapidly increase as the heat treatment time was increased to even 1000 hours, meaning that the diffusion blocking layer of Sample 3 has a significant diffusion blocking effect. It should be noted that elemental analysis of each sample by Auger electron spectroscopy after 500 hours of heat treatment of the sample showed that Cu had diffused into the GaAs substrate of Sample 1 whereas there was no sign of Cu diffusion into the GaAs substrates of Samples 2 and 3. This means that the electroplated layers of Samples 2 and 3 have a Cu diffusion blocking effect.

In summary, electroplated layers have a greater Cu diffusion blocking effect than electrolessly plated layers, and the addition of Ge to an electroplated layer further increases its Cu diffusion blocking effect.

As described above, Cu in the metal layer 18 migrates to an adjacent layer (e.g., the electroplated layer 50) and diffuses therein primarily via grain boundary diffusion. Therefore, the reason that the electroplated layer 50 containing Ge has an increased Cu diffusion blocking effect is thought to be that Ge in the electroplated layer 50 transforms the grain boundaries of the electroplated layer 50 so as to reduce grain boundary diffusion. Although the mechanisms for this transformation have not been elucidated, it is considered that Ge in the electroplated layer 50 may act to reduce the difference in orientation between adjacent crystal grains and thereby reduce the widths of grain boundaries, or may be located at grain boundaries so as to reduce grain boundary diffusion.

It should be noted that since the electroplated layer 50 contains Ge, it has increased resistance to high temperatures.

The method of manufacturing a semiconductor device in accordance with the second embodiment uses an electroplating solution containing Ge oxide. However, an electroplating solution containing any suitable compound may be used instead while still retaining the advantages described above. Examples of such compounds include Ge compounds, As compounds, Se compounds, B compounds, P compounds, Te compounds, Sb compounds, Tl compounds, Pb compounds, and S compounds which are capable of serving as a crystal control agent for altering the grain boundaries of the electroplated layer. Examples of such Ge compounds include Ge oxide, as described above. Examples of such As compounds include potassium arsenite. Examples of such Se compounds include selenious acid. Examples of such B compounds include dimethylamine borane. Examples of such P compounds include sodium hypophosphite. Examples of such Te compounds include potassium tellurate. Examples of such Sb compounds include potassium antimonate. Examples of such Tl compounds include thallium formate, thallium malonate, thallium sulfate, and thallium nitrate. Examples of such Pb compounds include lead citrate, lead nitrate, and lead alkanesulfonate. Examples of such S compounds include sodium thiosulfate. Therefore, the electroplated layer 50 can have the diffusion blocking effect described above if it contains Ge, As, Se, B, P, Te, Sb, Tl, Pb, or S. The concentration of Ge, As, Se, B, P, Te, Sb, Tl, Pb, or S in the electroplated layer 50 is preferably in the range of from 1 ppm to 10000 ppm, inclusive.

Third Embodiment

Figure 12:
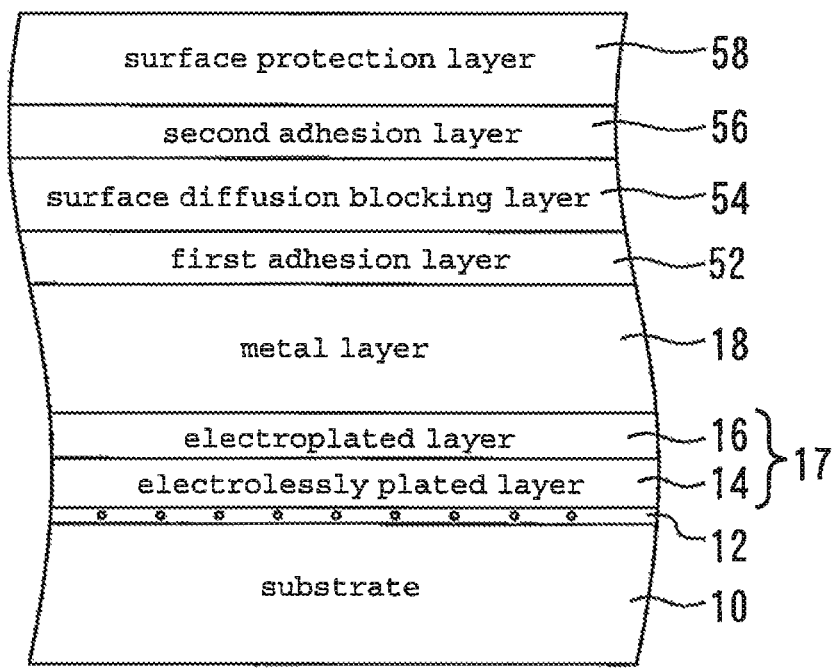
FIG. 12 is a cross-sectional view of the semiconductor device of the third embodiment.

A third embodiment of the present invention provides a method of manufacturing a semiconductor device and also provides a semiconductor device. These method and semiconductor device have many features common to the method and semiconductor device of the first embodiment. Therefore, the following description of the third embodiment will be primarily limited to the differences from the first embodiment. FIG. 12 is a cross-sectional view of the semiconductor device of the third embodiment. This semiconductor device has a surface protection layer 58 on its top surface.

The method of manufacturing a semiconductor device in accordance with the third embodiment will now be described. After forming the diffusion blocking layer 17 and the metal layer 18 by the method of the first embodiment, a first adhesion layer 52 is formed on the metal layer 18. Specifically, the first adhesion layer 52 is formed by immersing the substrate 10 in an electroless NiP plating solution.

The first adhesion layer 52 is formed of NiP material, which has relatively high internal stress. If a layer of NiP material is formed on a thin substrate to a thickness of 1 μm or more, the substrate will warp. In order to avoid this problem, the thickness of the first adhesion layer 52 is preferably less than 1 μm. It should be noted that a Ni film having a thickness of 1 μm or less tends to have pinholes if it is formed by electroplating, but does not if it is formed by electroless plating.

Next, a surface diffusion blocking layer 54 is formed on the first adhesion layer 52 by electroplating. Specifically, the substrate 10 is immersed in a Pd plating solution containing Ge oxide, and a DC power supply is connected to the substrate and a separate platinum-coated titanium electrode (which is also immersed in the Pd plating solution) so that the substrate acts as a cathode and the titanium electrode acts as an anode. A current is then applied between the cathode (the substrate) and the anode (the titanium electrode) to form the surface diffusion blocking layer 54.

A second adhesion layer 56 is then formed on the surface diffusion blocking layer 54. The second adhesion layer 56 is formed in the same manner as the first adhesion layer 52. A surface protection layer 58 is then formed on the second adhesion layer 56. Specifically, the surface protection layer 58 is formed of Au and produced by immersing the substrate 10 in a displacement Au plating solution. The displacement Au plating solution contains, e.g., sodium gold sulfite, a sulfite salt, or a chelating agent. The gold concentration in the solution is preferably 1-5 g/L. The temperature of the plating bath is preferably approximately 60-80° C.

The surface protection layer 58 of Au, which is an oxidation resistant material, covers and is exposed at the top surface of the semiconductor device of the third embodiment. This prevents oxidation and corrosion of the metal layer 18, resulting in improved moisture resistance and improved stability in characteristics of the semiconductor device. Further, since the surface protection layer 58 is made of Au, it has increased solder wettability, facilitating wetting of the top surface of the semiconductor device with solder.

Further, since the surface diffusion blocking layer 54 is formed on the Cu metal layer 18 by electroplating, it is unlikely that Cu in the metal layer will diffuse to the surface protection layer 58 via grain boundary diffusion, thus preventing reaction of the metal layer 18 with the surface protection layer 58 and the resulting formation of an alloy.

The formation of the surface diffusion blocking layer 54 allows for a reduction in the thickness of the surface protection layer 58, which is formed of expensive Au, resulting in decreased cost of the semiconductor device. It should be noted that die bonding to the surface of the surface protection layer 58 by use of Ag paste or AuSn solder requires heat treatment during or after the bonding process. If it were not for the surface diffusion blocking layer 54, such heat treatment might result in formation of an alloy of the bonding material and Cu in the metal layer 18 and therefore cause peeling of the bonding material. In the semiconductor device of the third embodiment, however, the presence of the surface diffusion blocking layer 54 prevents such alloy formation.

The material of the first and second adhesion layers 52 and 56 may be any suitable Ni- or Ti-based metal. Further, the first adhesion layer 52 is not required if the adhesion between the metal layer 18 and the surface diffusion blocking layer 54 is sufficient without the first adhesion layer 52, and the second adhesion layer 56 is not also required if the adhesion between the surface diffusion blocking layer 54 and the surface protection layer 58 is sufficient without the second adhesion layer 56.

The surface protection layer 58 may be formed of any suitable material having greater oxidation resistance than the metal layer 18. For example, the surface protection layer 58 may be formed of a noble metal such as Pt, Pd, or Rh. Further, the surface protection layer 58 may be formed of an insulator, such as silicon oxide, silicon nitride, polyimide, or BCB, or a semiconductor, such as silicon.

The surface diffusion blocking layer 54 is preferably formed by electroplating in order to enhance its diffusion blocking effect. Therefore, the surface diffusion blocking layer 54 may be formed of Ni, Pd, Mo, Rh, or Ru by electroplating. Further, the surface diffusion blocking layer 54 may be formed of a metal which provides a greater diffusion blocking effect than Pd. Examples of such metals include Ti, TiN, Ta, TaN, W, and WN. Further, the surface diffusion blocking layer 54 may be produced by electroless plating and formed of a Co-based metal, such as CoWP, or a Ni-based metal, such as NiP, or formed of Pt, Pd, Rh, or Ru. Such an electrolessly plated layer also has some diffusion blocking effect.

It should be noted that the diffusion blocking effect of the surface diffusion blocking layer 54 need not be as great as that of the diffusion blocking layer 17, since the surface diffusion blocking layer 54 only needs to prevent diffusion from the metal layer 18 whereas the diffusion blocking layer 17 needs to prevent counter-diffusion between Cu in the metal layer 18 and components of the substrate 10. Therefore, the surface diffusion blocking layer 54 may be formed of a metal and produced by electroless plating, vapor deposition, or sputtering, etc., instead of electroplating.

The surface protection layer 58 may be made of a material having greater oxidation resistance than the metal layer 18 and directly formed on and in contact with the metal layer 18, thereby omitting the first adhesion layer 52, the surface diffusion blocking layer 54, and the second adhesion layer 56. In this case, the surface protection layer may be formed of, e.g., Pd. A Pd layer has greater oxidation resistance than the metal layer 18 of Cu or Ag and has some Cu diffusion blocking effect.

It should be noted that the above surface protection layer 58 may be formed on the semiconductor device of the second embodiment.

Fourth Embodiment

Figure 13:
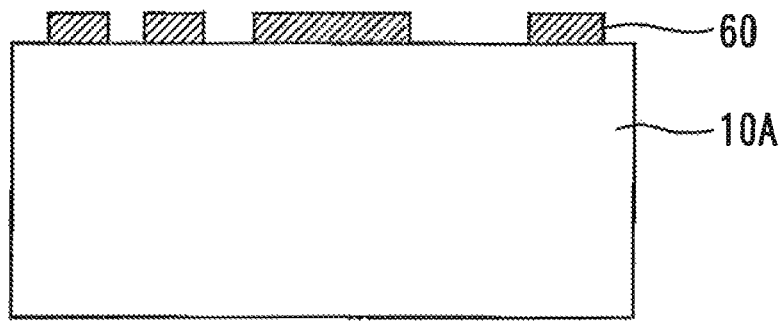
FIG. 13 is a cross-sectional view of a substrate.

A fourth embodiment of the present invention provides a method of manufacturing a semiconductor device having a via structure, wherein the via structure is formed by a method similar to that of the third embodiment. FIG. 13 is a cross-sectional view of a substrate having an electrode thereon after the electrode has been formed by the first step of the semiconductor device manufacturing method of the fourth embodiment. The method of the fourth embodiment proceeds as follows. First, an electrode 60 is formed on the top surface of a substrate 10A formed of GaAs. In this step, device structures such as transistors are also formed on the top surface of the substrate 10A.

Figure 14:
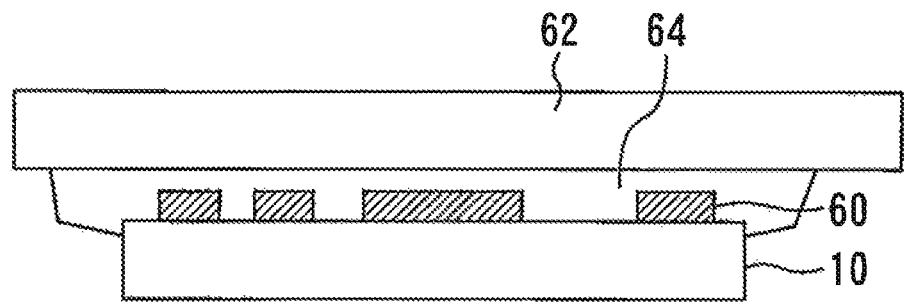
FIG. 14 is a cross-sectional view of the substrate after the support substrate has been bonded thereto.

Next, a support substrate is bonded to the top surface of the substrate 10A. FIG. 14 is a cross-sectional view of the substrate 10A after the support substrate has been bonded thereto. Specifically, in this step, a support substrate 64 of sapphire or synthetic quartz having a thickness of approximately 1 mm and held by an adhesive material 62 such as wax or tape is bonded to the top surface of the substrate 10A.

Figure 15:
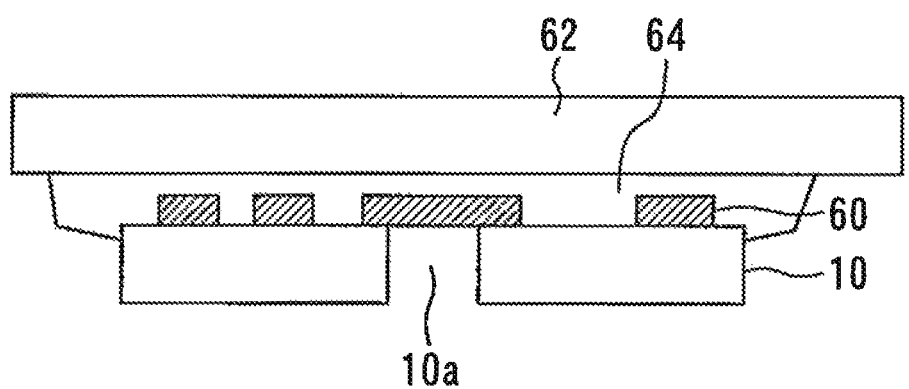
FIG. 15 is a cross-sectional view of the substrate after the via hole has been formed therein.

A via hole is then formed in the substrate 10. FIG. 15 is a cross-sectional view of the substrate after the via hole has been formed therein. Specifically, in this step, the substrate 10 is etched from the bottom surface side thereof so as to form a via hole 10a which penetrates through the substrate 10 and extends from the bottom surface of the substrate 10 to the bottom surface of the electrode 60.

Figure 16:
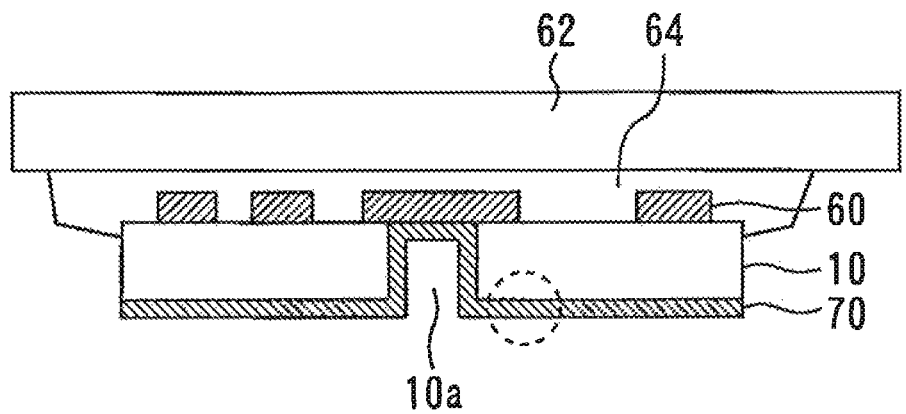
FIG. 16 is a cross-sectional view of the substrate after the heat-radiating electrode has been formed thereon.

A heat-radiating electrode is then formed. FIG. 16 is a cross-sectional view of the substrate after the heat-radiating electrode has been formed thereon. The heat-radiating electrode 70 has layers described in connection with the third embodiment. Specifically, the heat-radiating electrode 70 includes the Pd—Ga—As layer 12 (formed as a result of adhesion of a metal catalyst to the substrate), the electrolessly plated layer 14, the electroplated layer 16, the metal layer 18, the first adhesion layer 52, the Pd layer 54, the second adhesion layer 56, and the surface protection layer 58. These layers of the heat-radiating electrode 70 are formed to extend over the inner wall of the via hole 10a and the bottom surface of the electrode 60.

Figure 17:
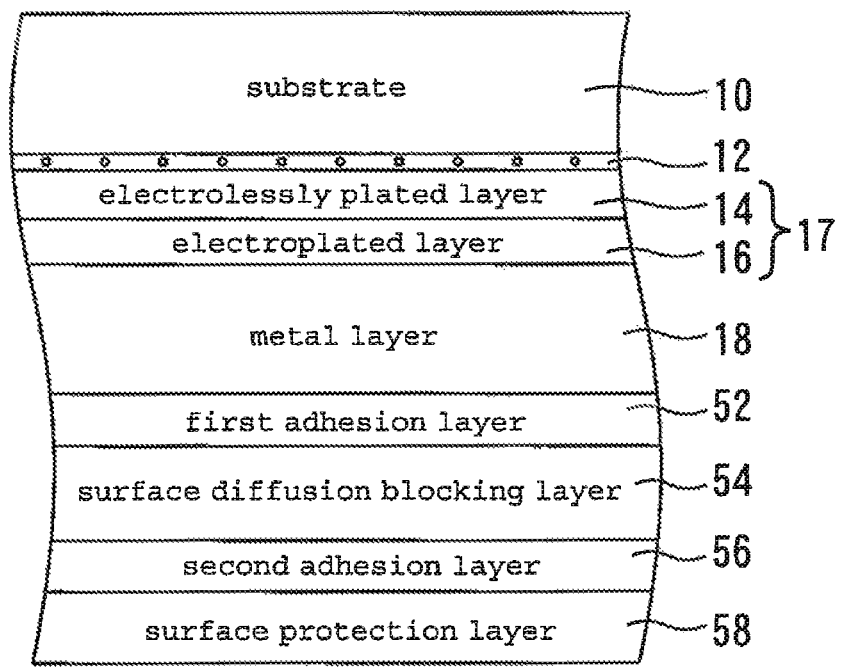
FIG. 17 is an enlarged view of the portion shown in the dashed line of FIG. 16.

FIG. 17 is an enlarged view of the portion shown in the dashed line of FIG. 16. FIG. 17 shows the layers of the heat-radiating electrode 70. The heat-radiating electrode 70 has significantly high covering ability, since it includes the diffusion blocking layer 17, which is formed by plating. This means that the diffusion blocking layer 17 can be formed to cover the entire inner wall of the via hole 20a.

In the field of compound semiconductor devices, etc., devices are often configured to have heat-radiating electrodes, which are electrodes having good heat dissipation characteristics. It should be noted that heat-radiating electrodes formed solely of Au are expensive although they have stable characteristics. The heat-radiating electrode 70 of the fourth embodiment, on the other hand, includes the Cu metal layer 18, etc., in addition to the surface protection layer 58 of Au, resulting in decreased manufacturing cost of the semiconductor device.

It should be noted that the first adhesion layer 52, the Pd layer 54, the second adhesion layer 56, and the surface protection layer 58 may be omitted from the heat-radiating electrode 70.

Fifth Embodiment

Figure 18:
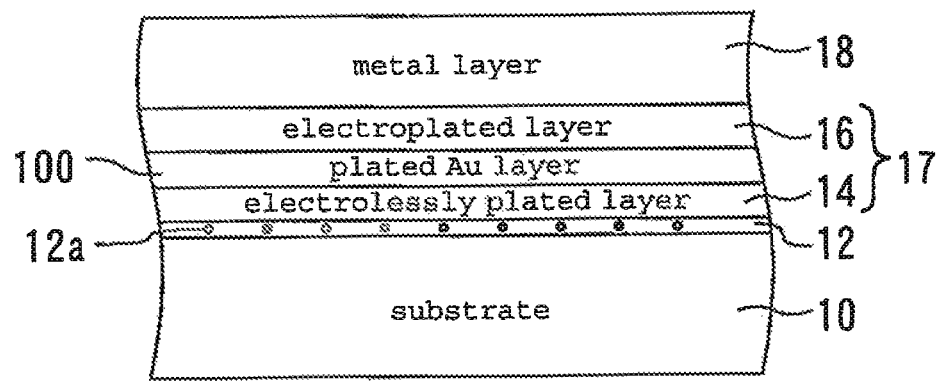
FIG. 18 is a cross-sectional view of the semiconductor device of the fifth embodiment.

A fifth embodiment of the present invention provides a method of manufacturing a semiconductor device and also provides a semiconductor device. These method and semiconductor device have many features common to the method and semiconductor device of the first embodiment. Therefore, the following description of the fifth embodiment will be primarily limited to the differences from the first embodiment. FIG. 18 is a cross-sectional view of the semiconductor device of the fifth embodiment. The electroplated layer 16 is formed of Ru. A plated Au layer 100 is provided between the electrolessly plated layer 14 and the electroplated layer 16. It should be noted that the plated Au layer 100 may be replaced by an Au layer formed by a method other than plating.

The plated Au layer 100 is formed on the electrolessly plated layer 14 after forming the electrolessly plated layer 14. The substrate is then immersed in an electroplating solution, and the electroplated layer 16 is formed on the plated Au layer 100 using the electrolessly plated layer 14 and the plated Au layer 100 as power feeding layers.

The advantages resulting from forming the electroplated Ru layer will be described. FIG. 9 is a graph comparing the Cu diffusion blocking effect of two different samples. Sample 4 was produced as follows: a first NiP layer (having a thickness of 0.5 μm) was formed on a GaAs substrate in an electroless plating solution after applying catalyst treatment to the surface of the substrate using a Pd activating solution; a first Pd layer (0.2 μm) was then formed on the first NiP layer in an electroplating solution containing Ge; a Cu layer (a metal layer having a thickness of 3 μm) was then formed on the first Pd layer in an electroplating solution; a second NiP layer (0.5 μm) was then formed on the Cu layer in an electroless plating solution; a second Pd layer (0.2 μm) was then formed on the second NiP layer in an electroplating solution; and an Au layer (0.05 μm) was then formed on the second Pd layer in a displacement plating solution. Thus, the electroplated layer of Sample 4 (between the GaAs substrate and the Cu layer) is a Ge-containing Pd layer.

Sample 5 was produced as follows: a first NiP layer (0.5 μm) was formed on a GaAs substrate in an electroless plating solution after applying catalyst treatment to the surface of the substrate using a Pd activating solution; a first Au layer (0.05 μm) was then formed on the first NiP layer in a displacement Au plating solution; an Ru layer (0.2 μm) was then formed on the first Au layer in an electroplating solution; a Cu layer (a metal layer having a thickness of 3 μm) was then formed on the Ru layer in an electroplating solution; a second NiP layer (0.5 μm) was then formed on the Cu layer in an electroless plating solution; a Pd layer (0.2 μm) was then formed on the second NiP layer in an electroplating solution; and a second Au layer (0.05 μm) was then formed on the Pd layer in a displacement plating solution. Thus, the electroplated layer of Sample 5 (between the GaAs substrate and the Cu layer) is a Ru layer. It should be noted that a sample similar to Sample 5 but without the first plated Au layer was found to have cracks in a portion of the electroplated Ru layer, whereas the electroplated Ru layer of Sample 5 was found to have substantially no cracks since Sample 5 has the first plated Au layer.

Figure 19:
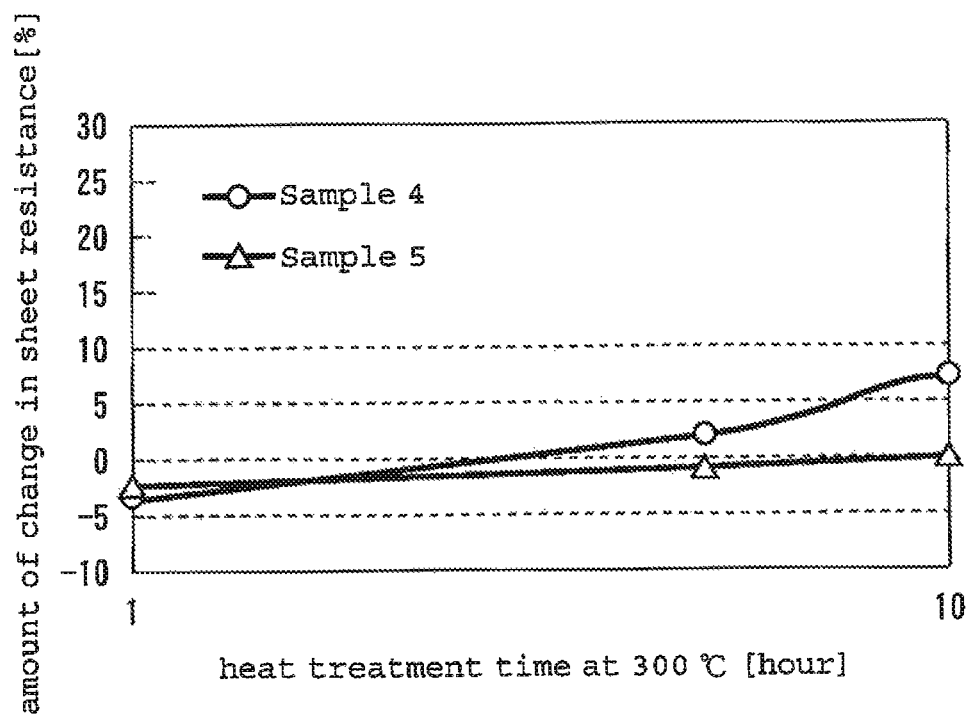
FIG. 19 shows the amount of change in sheet resistance.

These samples were heat treated, and the amount of change in sheet resistance of each sample due to heat treatment was measured and plotted against heat treatment time. (The heat treatment temperature was maintained at 300° C.) In FIG. 19, the vertical axis represents the amount of change in sheet resistance of each sample due to heat treatment, expressed in percentage of the sheet resistance of the sample before the heat treatment, and the horizontal axis represents heat treatment time. As can be seen from FIG. 19, the sheet resistance of Sample 4 increased 5% or more due to 10 hours of heat treatment, whereas the sheet resistance of Sample 5 did not substantially increase under the same conditions. This indicates that the electroplated Ru layer has a greater Cu diffusion blocking effect than the electroplated Pd layer. The reason that the Ru layer has a greater Cu diffusion blocking effect is that the melting point (2050° C.) of Ru is higher than the melting point (1552° C.) of Pd and hence the Ru layer has higher thermal stability than the Pd layer. It should be noted that features of the semiconductor manufacturing methods and the semiconductor devices of embodiments described above may be combined where appropriate.

Thus in accordance with the present invention, a diffusion blocking layer that includes two layers formed by electroless plating and electroplating, respectively, is provided between a substrate and a metal layer of, e.g., Cu. The diffusion blocking layer has high covering ability, since the entire diffusion blocking layer is formed by plating. Further, the electroplated layer of the diffusion blocking layer serves to reduce diffusion of components of the metal layer, such as Cu, into the substrate.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-080609, filed on Apr. 8, 2013, and Japanese Patent Application No. 2012-239106, filed on Oct. 30, 2012, including specifications, claims, drawings, and summaries, on which the Convention priorities of the present application is based, are incorporated herein by reference in their entirety.

What is claimed is:

1. A method of manufacturing a semiconductor device, comprising:
   immersing a substrate in a solution containing metal ions and adhering a metal catalyst to a surface of said substrate;
   immersing said substrate with said metal catalyst adhered thereto in an electroless plating solution and electrolessly plating an electrolessly plated layer on said substrate;
   immersing said substrate in an electroplating solution and electroplating an electroplated layer on said electrolessly plated layer, using said electrolessly plated layer as a power feeding layer; and
   forming a metal layer of Cu or Ag on said electroplated layer, wherein said electroplated layer is a different material from said metal layer.

2. The method according to claim 1, wherein said electroplating solution contains a compound selected from the group consisting of a Ge compound, an As compound, an Se compound, a B compound, a P compound, a Te compound, an Sb compound, a Tl compound, a Pb compound, and an S compound, each of which functions as a crystal control agent for altering grain boundaries of said electroplated layer to reduce grain boundary diffusion of a component of said metal layer.

3. The method according to claim 2, wherein
   said electroplated layer contains a concentration of an element selected from the group consisting of Ge, As, Se, B, P, Te, Sb, Tl, Pb, and S, and
   the concentration is in a range from 1 ppm to 10000 ppm, inclusive.

4. The method according to claim 1, wherein said substrate is GaAs, and said electrolessly plated layer is NiP.

5. The method according to claim 1, further comprising forming, on said metal layer, a surface protection layer of a material having greater oxidation resistance than said metal layer.

6. The method according to claim 1, wherein said surface of said substrate includes one of a recess, a projection, and a through-hole.

7. The method according to claim 1, further comprising:
   forming an electrode on a top surface of said substrate; and
   forming a via hole which penetrates through said substrate and extends from a bottom surface of said substrate to a bottom surface of said electrode, wherein said metal catalyst, said electrolessly plated layer, said electroplated layer, and said metal layer are present on an inner wall of said via hole and said bottom surface of said electrode.

8. The method according to claim 1, wherein said electroplated layer is a metal selected from the group consisting of Pd, Ru, Pt, and Rh.

9. A method of manufacturing a semiconductor device comprising:
- immersing a substrate in a solution containing metal ions and adhering a metal catalyst to a surface of said substrate;
- immersing said substrate with said metal catalyst adhered thereto in an electroless plating solution and electrolessly plating an electrolessly plated layer on said substrate;
- immersing said substrate in an electroplating solution and electroplating an electroplated layer on said electrolessly plated layer, using said electrolessly plated layer as a power feeding layer;
- forming a metal layer of Cu or Ag on said electroplated layer, wherein said electroplated layer is a different material from said metal layer;
- forming, on said metal layer, a surface diffusion blocking layer of a metal for reducing diffusion of a component of said metal layer; and
- forming, on said surface diffusion blocking layer, a surface protection layer of a material having greater oxidation resistance than said metal layer.

10. The method according to claim 9, further comprising:
- forming a first adhesion layer on said metal layer before forming said surface diffusion blocking layer; and
- forming a second adhesion layer on said surface diffusion blocking layer before forming said surface protection layer; wherein
- said first adhesion layer is located between said metal layer and said surface diffusion blocking layer, and
- said second adhesion layer is located between said surface diffusion blocking layer and said surface protection layer.

11. A method of manufacturing a semiconductor device, comprising:
- immersing a substrate in a solution containing metal ions and adhering a metal catalyst to a surface of said substrate;
- immersing said substrate with said metal catalyst adhered thereto in an electroless plating solution and electrolessly plating an electrolessly plated layer on said substrate;
- plating an Au layer on said electrolessly plated layer;
- immersing said substrate in an electroplating solution and electroplating an electroplated layer on said plated Au layer, using said electrolessly plated layer and said plated Au layer as power feeding layers; and
- forming a metal layer of Cu or Ag on said electroplated layer, wherein said electroplated layer is formed of a different material from said metal layer.

12. The method according to claim 11, wherein said electroplated layer is Ru.

* * * * *